US009715986B2

(12) United States Patent
Neto et al.

(10) Patent No.: US 9,715,986 B2
(45) Date of Patent: Jul. 25, 2017

(54) ELECTRICAL RELAY ASSEMBLY

(71) Applicant: DELPHI TECHNOLOGIES, INC., Troy, MI (US)

(72) Inventors: Didimo Garcia Neto, Sao Paulo (BR); Rodrigo Franco, Sao Paulo (BR)

(73) Assignee: DELPHI TECHNOLOGIES, INC., Troy, MI (US)

( * ) Notice: Subject to any disclaimer, the term of this patent is extended or adjusted under 35 U.S.C. 154(b) by 95 days.

(21) Appl. No.: 14/425,948

(22) PCT Filed: Jul. 23, 2013

(86) PCT No.: PCT/US2013/051589
§ 371 (c)(1),
(2) Date: Mar. 4, 2015

(87) PCT Pub. No.: WO2014/046779
PCT Pub. Date: Mar. 27, 2014

(65) Prior Publication Data

US 2015/0228437 A1 Aug. 13, 2015

Related U.S. Application Data

(60) Provisional application No. 61/703,302, filed on Sep. 20, 2012.

(51) Int. Cl.

| | |
|---|---|
| ***H05K 7/00*** | (2006.01) |
| ***H01H 89/00*** | (2006.01) |
| ***H01H 50/02*** | (2006.01) |
| ***H01H 85/02*** | (2006.01) |

(Continued)

(52) U.S. Cl.
CPC .......... *H01H 89/00* (2013.01); *H01H 50/021* (2013.01); *H01H 50/048* (2013.01); *H01H 85/0241* (2013.01); *H01H 85/2035* (2013.01); *H01H 2085/0275* (2013.01); *H01H 2085/208* (2013.01)

(58) Field of Classification Search
CPC . H05K 7/026; H05K 7/18; H01R 9/24; H01R 13/6658
USPC ........ 361/622, 752–753, 830–833, 760–762, 361/772–774; 439/76.2, 620–621, 698
See application file for complete search history.

(56) References Cited

U.S. PATENT DOCUMENTS

| | | | | |
|---|---|---|---|---|
| 4,808,114 A | | 2/1989 | Mohri et al. | |
| 5,145,414 A | * | 9/1992 | Oikawa .............. | H01H 85/2035 439/374 |

(Continued)

OTHER PUBLICATIONS

International Search Report for PCT/US2013/051589, published Nov. 12, 2013.

(Continued)

*Primary Examiner* — Tuan T Dinh
(74) *Attorney, Agent, or Firm* — Robert J. Myers

(57) ABSTRACT

A relay assembly configured for use in a vehicle electrical distribution center. The relay assembly includes a circuit board, a first and second relay disposed the circuit board and a plurality of terminals electrically coupled to the first and second relays. The relay assembly also includes removable fuses to protect the circuits controlled by the first and second relays against over-current conditions. In one embodiment, the relay assembly is packaged as a mini-ISO relay package.

5 Claims, 5 Drawing Sheets

(51) Int. Cl.
*H01H 85/20* (2006.01)
*H01H 50/04* (2006.01)

(56) References Cited

U.S. PATENT DOCUMENTS

| | | | | |
|---|---|---|---|---|
| 5,179,503 | A * | 1/1993 | Fouts | H05K 7/026 307/10.1 |
| 5,403,193 | A * | 4/1995 | Ito | H01R 9/245 439/34 |
| 5,632,654 | A * | 5/1997 | Sugiura | H01H 85/2035 337/186 |
| 5,715,135 | A * | 2/1998 | Brussalis | B60R 16/0238 361/622 |
| 5,882,213 | A | 3/1999 | Witek et al. | |
| 6,150,734 | A | 11/2000 | Neibecker et al. | |
| 6,224,397 | B1 * | 5/2001 | Nakamura | H01R 9/24 439/76.2 |
| 6,468,091 | B2 * | 10/2002 | Roussel | B60R 16/0238 361/744 |
| 7,232,342 | B2 * | 6/2007 | Kubota | H01H 85/2035 439/620.33 |
| 8,027,168 | B2 * | 9/2011 | Senk | B60R 16/0238 174/387 |
| 2002/0126462 | A1 * | 9/2002 | Roussel | B60R 16/0238 361/760 |
| 2004/0021547 | A1 | 2/2004 | Vicenza et al. | |
| 2004/0112624 | A1 * | 6/2004 | Kubota | H01R 9/2458 174/59 |
| 2010/0202120 | A1 * | 8/2010 | Kita | H05K 7/026 361/752 |
| 2010/0317241 | A1 | 12/2010 | Sugiura et al. | |
| 2011/0299229 | A1 | 12/2011 | De La Reza et al. | |
| 2012/0003881 | A1 | 1/2012 | Hora | |

OTHER PUBLICATIONS

PCB Relay G2RL, Datasheet (online). Omron Electronic Components, Sep. 1, 2011 (retrieved on Nov. 26, 2013). retrieved from the internet: URL:http://www.components.comron.com; 6 pages.

* cited by examiner

ELECTRICAL RELAY ASSEMBLY

TECHNICAL FIELD OF INVENTION

The invention generally relates to an electrical relay assembly, and more particularly relates to an electrical relay assembly including at least two relays and configured to be used with an electrical distribution center.

BACKGROUND OF THE INVENTION

Automotive wiring systems sometimes require more relay controlled circuits that can be accommodated by the electrical distribution center (EDC) of the vehicle. In this situation, there are two possible solutions: redesign the electrical distribution center to include additional relay connectors or add relay connectors to the vehicle wiring system outside of the electrical distribution center. Adding additional relay connectors will likely increase the size of the EDC, making packaging of the EDC within the vehicle more difficult. The electrical content requiring the additional relays may only be used on the most highly optioned vehicles, so an additional cost for a larger EDC would put a cost penalty on vehicles with lower electrical content. Adding relay connectors to the wiring system may increase costs and complexity of the wiring system as well as decrease reliability since hard wired connections have to be made.

BRIEF SUMMARY OF THE INVENTION

In accordance with one embodiment of this invention, a relay assembly configured for use in a vehicle electrical distribution center is provided. The relay assembly includes a circuit board characterized by electrically conductive traces disposed on at least a first surface of the circuit board, a first electrical relay device disposed on the first surface and electrically coupled to the electrically conductive traces; and a second electrical relay device disposed on the first surface and electrically coupled to the electrically conductive traces. The relay assembly also includes a first electrically conductive terminal disposed on a second surface of the circuit board and electrically coupled to the first electrical relay device and a second electrically conductive terminal disposed on a second surface of the circuit board and electrically coupled to the second electrical relay device.

In accordance with another embodiment of this invention, the relay assembly further includes a fusible link, a third electrically conductive terminal electrically that is coupled to the first relay and the fusible link, and a fourth electrically conductive terminal that is electrically coupled to the first conductive terminal and the fusible link.

In accordance with yet another embodiment of this invention, the relay assembly additionally includes a cover configured to enclose at least the first surface of the circuit board. The cover defines an opening configured to allow access to the fusible link.

Further features and advantages of the invention will appear more clearly on a reading of the following detailed description of the preferred embodiment of the invention, which is given by way of non-limiting example only and with reference to the accompanying drawings.

BRIEF DESCRIPTION OF THE SEVERAL VIEWS OF THE DRAWING

The present invention will now be described, by way of example with reference to the accompanying drawings, in which.

DETAILED DESCRIPTION OF THE INVENTION

A dual relay assembly that can be packaged within a single relay package, such as a mini-ISO relay package is presented. The dual relay assembly includes at least two relays, therefore when this relay assembly is packaged in a vehicle's electrical distribution center (EDC), the number of circuits that can be controlled by the EDC can be increased or the size of the ECD may be decreased. An embodiment of the relay assembly is presented that incorporates a replaceable fuse, thus allowing further reduction in the size of the EDC due to the elimination of a separate fuse holder in the EDC for the relay controlled circuit.

Figure 1:
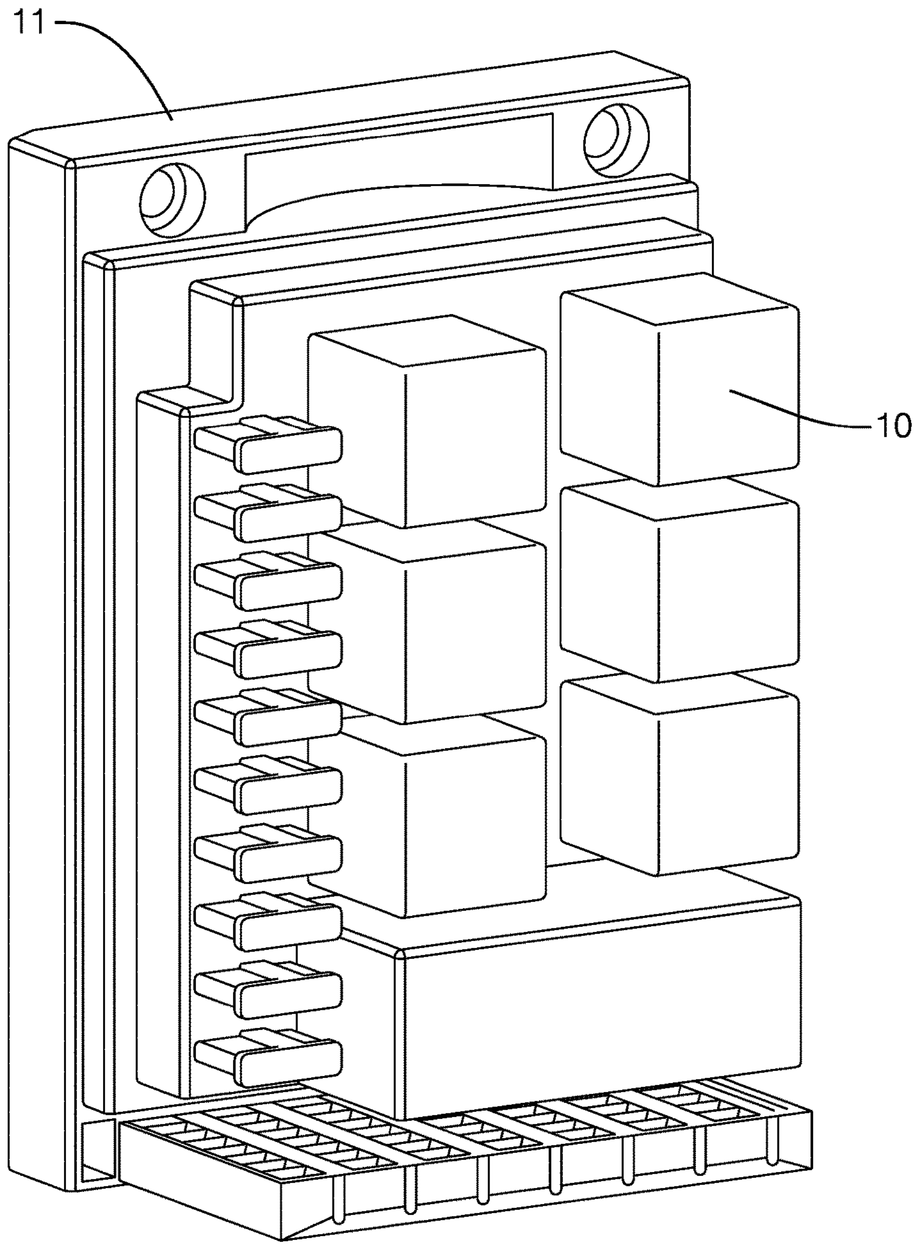
FIG. 1 is a perspective view of a electrical distribution center including a relay assembly in accordance with one embodiment.

FIG. 1 illustrates a non-limiting example of a relay assembly 10 configured for use in a vehicle electrical distribution center 11.

Figure 2:
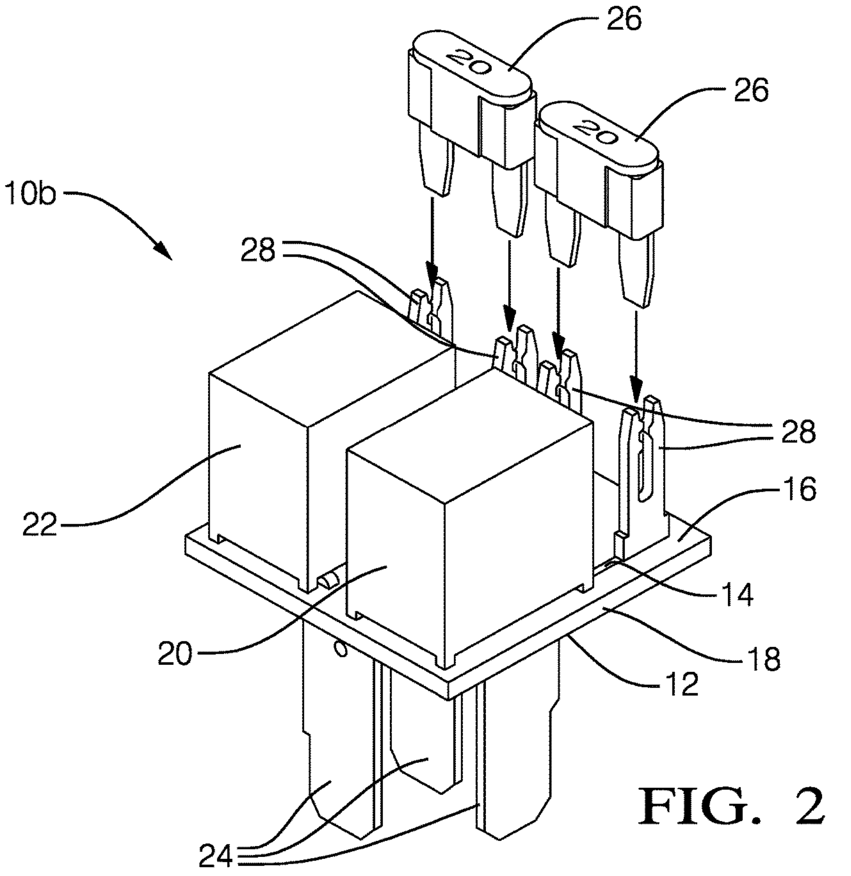
FIG. 2 is a perspective exploded view of the relay assembly in accordance with one embodiment.

A non-limiting example of the relay assembly 10 is illustrated in FIG. 2. The relay assembly 10 includes a single circuit board 12 having a plurality of electrically conductive traces 14 disposed on at least a first surface 16 of the circuit board 12. The circuit board 12 may also include conductive traces 14 on a second surface 18 of the circuit board 12 that are connected to the conductive traces 14 on the first surface 16 by conductive vias formed by plating holes defined in the circuit board 12 with a conductive material, such as copper. The circuit board 12 may be a printed circuit board (PCB) containing conductive traces 14 that are formed by a screen printing and/or a chemical etching process. The circuit board 12 may be made from epoxy or polyimide resins. The resin may be reinforced with a woven glass cloth or other matrix such as chopped fibers. Circuit boards formed of such materials are typically called FR-4 or G-10 type circuit boards. The circuit board 12 may alternately be constructed of ceramic or rigid polymers. This listing of acceptable circuit board 12 materials is not exhaustive and other materials may also be used successfully. The materials and manufacturing techniques used to form printed circuit boards are well known to those skilled in the art.

The relay assembly 10 also includes a first relay 20 and a second relay 22 disposed on the first surface 16 of the circuit board 12. The first relay 20 and the second relay 22 include a plurality of electrical terminals 24 that are electrically coupled to the electrically conductive traces 14. The first relay 20 and the second relay 22 may be a circuit board mountable electrically controlled mechanical (electromechanical) relay, such as Model PC520 available from Pickler Components of Carrollton, Tex. or Model AZ947 available from American Zettler, Inc. of Mission Viejo, Calif. The first relay 20 and the second relay 22 may alternatively be a solid state relay device including a metal-oxide-semiconductor field-effect transistor (MOSFET). The first and second relay 20, 22 may be identical relay types or may be different relay types, e.g. normally open, normally closed, based on the electrical application of the relay assembly 10.

Figure 3:
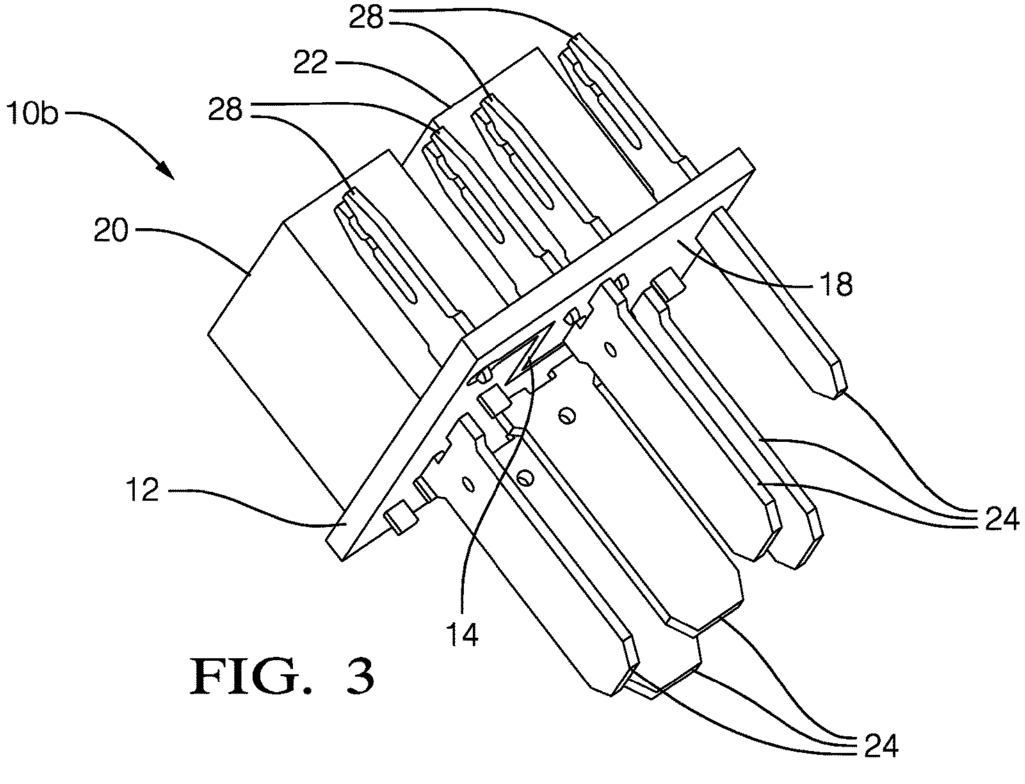
FIG. 3 is a perspective view of the relay assembly in accordance with one embodiment.

As best illustrated in FIG. 3, the relay assembly 10 also includes a plurality of electrically conductive terminals 24. The electrically conductive terminals 24 are disposed on the second surface 18 of the circuit board 12 opposite the first surface 16. The electrically conductive terminals 24 are electrically coupled to the conductive traces 14 and are thereby connected to the first relay 20 and second relay 22. The electrically conductive terminals 24 may be soldered to plated though holes (vias) in the circuit board 12. The electrically conductive terminals 24 may be male blade terminals that are configured to interface with female receptacle terminals in the electrical distribution center 11. Alternatively, the electrically conductive terminals 24 may be male pin terminals, female receptacle terminals, or any other type of terminal configured to interface with the corresponding terminals in the electrical distribution center 11.

Figure 5:
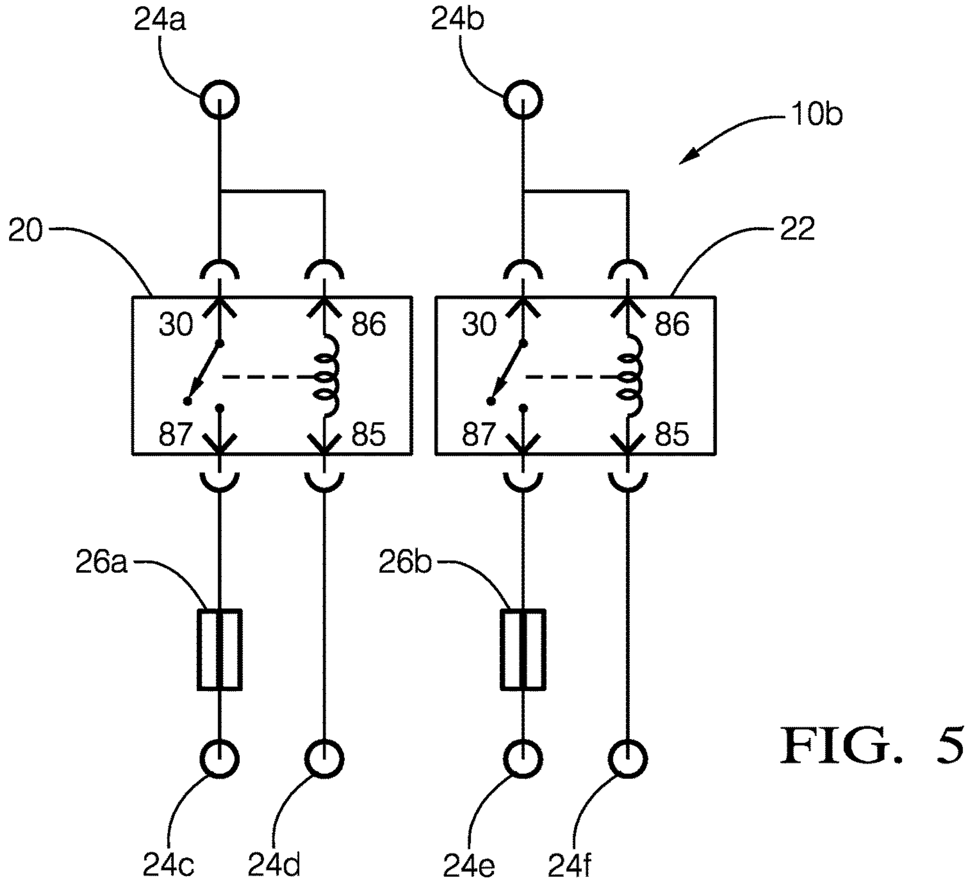
FIG. 5 is a schematic diagram of circuitry of the relay assembly in accordance with another embodiment.

Referring now to FIGS. 2 and 5, the relay assembly 10*b* may additionally include a fusible link 26 that is in-line with the load input terminal 24*c*, 24*e* of the first and/or second relay 20, 22. The fusible links 26 may be replaceable fuses, such as APM or ATM-type mini fuse available from Littelfuse, Inc. of Chicago, Ill. The fusible link 26*a* may be coupled to the load input terminal 24*c* via an electrically conductive terminal 28 such as a tuning fork terminal. An example of such a terminal is part number 13833338 available from Delphi Corporation of Troy, Mich. The electrically conductive terminals 28 may be disposed on the first surface 16 of the circuit board 12 that are configured to receive the fusible link 26*a* and connect to the load input terminal 24*c* by a conductive trace 14 on the circuit board 12. The fusible link 26*b* may also may be coupled to the an electrically conductive terminal 24*e* on the second surface 18 of the circuit board 12 via electrically conductive terminals 28 disposed on the first surface 16 of the circuit board 12 that are configured to receive the fusible link 26*b* and connect to the electrically conductive terminal 24*e* on the second surface 18 of the circuit board 12 by a conductive trace 14 on the circuit board 12.

Figure 4:
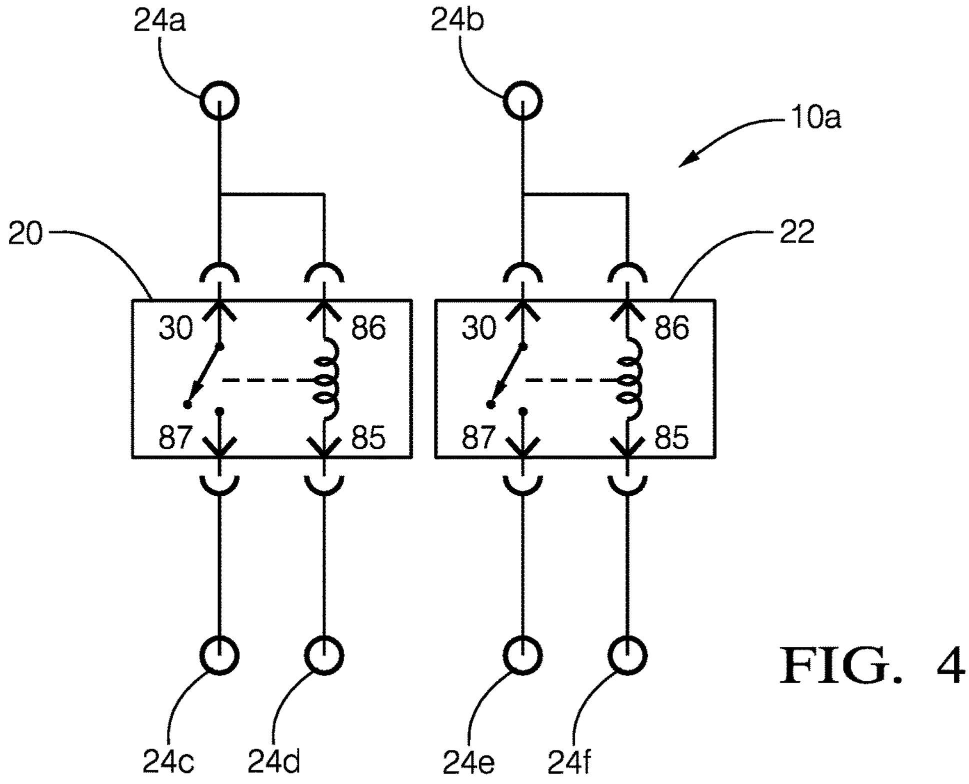
FIG. 4 is a schematic diagram of circuitry of the relay assembly in accordance with one embodiment.

A non-limiting example circuit diagram of the relay assembly 10*a* without a fusible link is illustrated in FIG. 4. The coil terminal 86 and the common terminal 30 of the first relay 20 may be connected to the same electrically conductive terminal 24*a*. The coil terminal 86 and the common terminal 30 of the second relay 22 may be connected to the same electrically conductive terminal 24*b*. The normally open terminal 87 of the first relay 20 may be connected to the electrically conductive terminal 24*c*. The coil terminal 87 of the first relay 20 may be connected directly to electrically conductive terminal 24*d*. Similarly, the normally open terminal 87 of the second relay 22 may be connected to the electrically conductive terminal 24*e* and the coil terminal 87 of the second relay 22 may be connected directly to electrically conductive terminal 24*f*. The embodiment of the relay assembly 10 illustrated in FIG. 4 provides a 6 pin relay assembly 10*b*. Alternatively, pins 24*a* and 24*b* may be combined to a single pin to provide a 5 pin relay assembly 10*a*.

A non-limiting example circuit is of another embodiment of the relay assembly 10*b* with a fusible link 26 is illustrated in FIG. 5. The coil terminal 86 and the common terminal 30 of the first relay 20 may be connected to the same electrically conductive terminal 24*a*. The coil terminal 86 and the common terminal 30 of the second relay 22 may be connected to the same electrically conductive terminal 24*b*. The normally open terminal 87 of the first relay 20 may be connected to the electrically conductive terminal 24*c* through the fusible link 26*a*. The coil terminal 87 of the first relay 20 may be connected directly to electrically conductive terminal 24*d*. Similarly, the normally open terminal 87 of the second relay 22 may be connected to the electrically conductive terminal 24*e* through the fusible link 26*b* and the coil terminal 87 of the second relay 22 may be connected directly to electrically conductive terminal 24*f*. This embodiment of the relay assembly 10 illustrated in FIG. 5 also provides a 6 pin relay assembly 10*b*. Alternatively, pins 24*a* and 24*b* may be combined to a single pin to provide a 5 pin relay assembly 10*a*.

Figure 6:
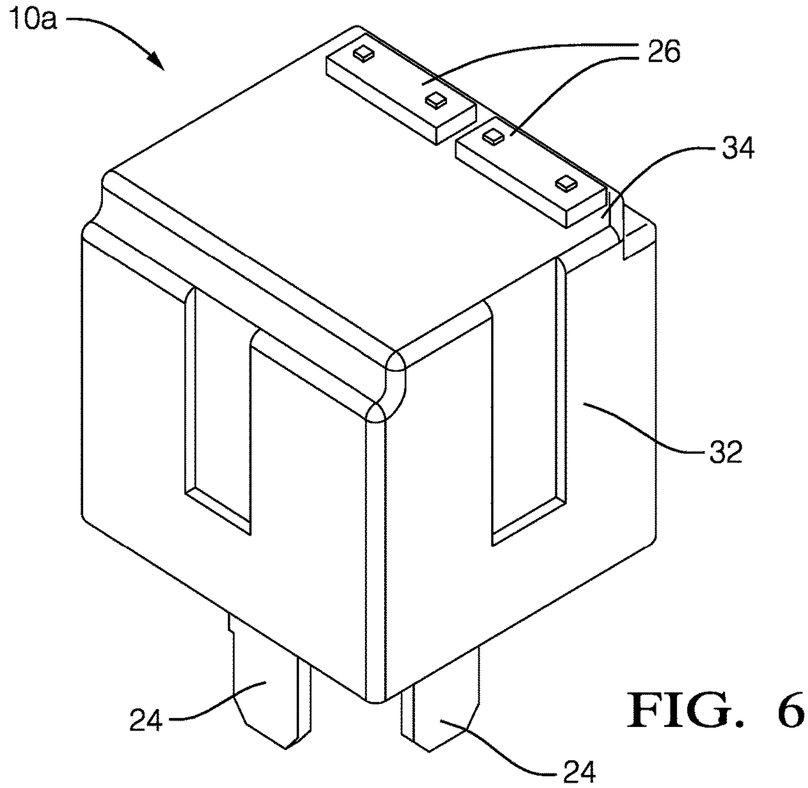
FIG. 6 is a perspective view of the relay assembly having a cover in accordance with another embodiment.
Figure 7:
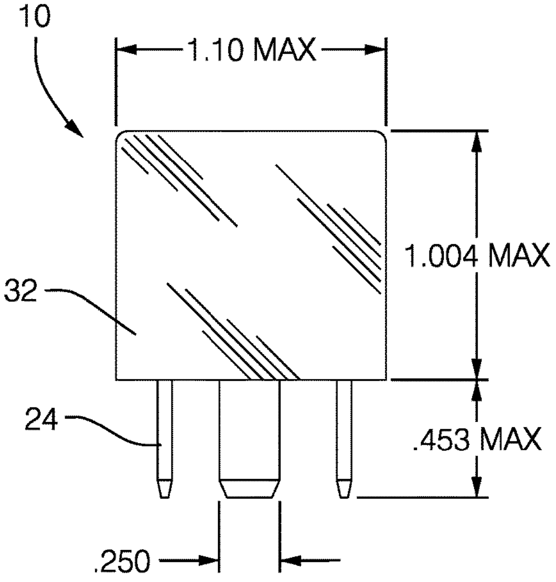
FIGS. 7 and 8 illustrate the dimensions of a mini-ISO relay package.
Figure 8:
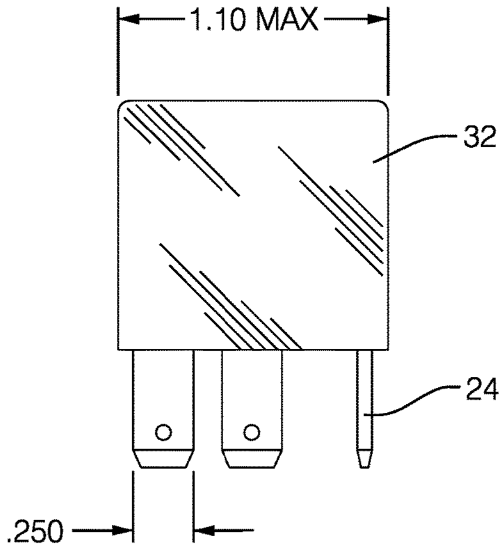
Figure 9:
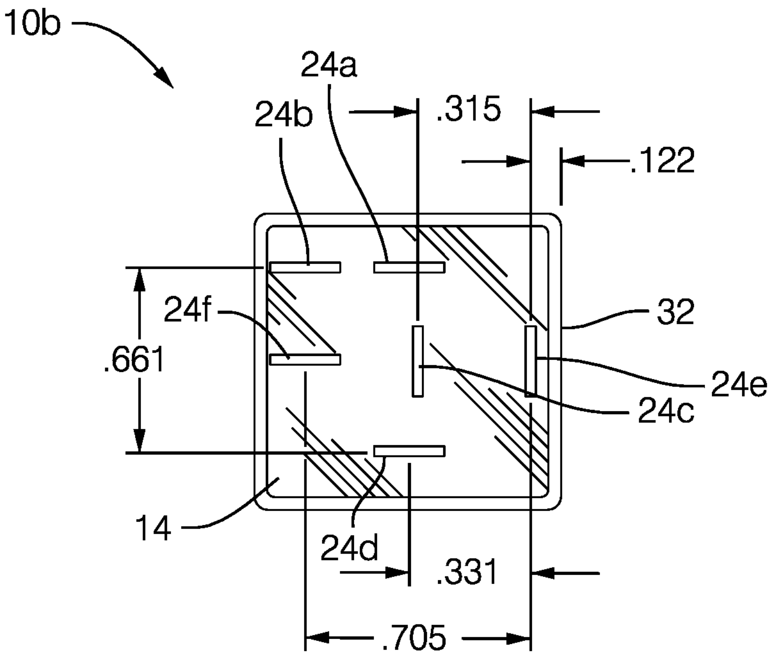
FIG. 9 is an illustration of the terminal dimensions of a mini-ISO relay package having 6 terminals.
Figure 10:
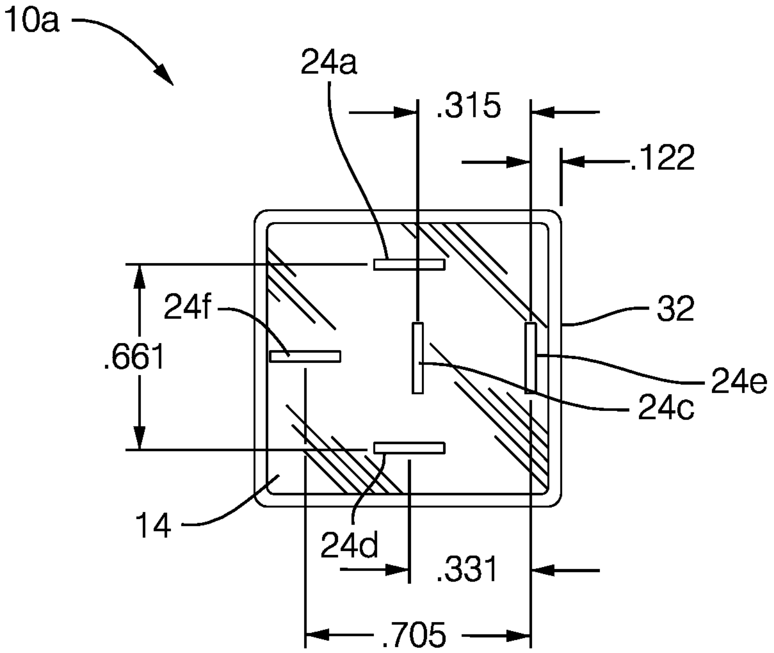
FIG. 10 is an illustration of the terminal dimensions of a mini-ISO relay package having 5 terminals.

As illustrated in FIG. 6, the relay assembly 10 includes a cover 32 that is configured to enclose at least the first surface 16 of the circuit board 12. The cover 32 is also configured to provide environmental protection for the first relay 20 and the second relay 22. The housing may define an opening 34 configured to allow access to the fusible link 26 so that the fusible may be replaced in the relay assembly 10 if it fails (opens) in service. The cover may be formed of a dielectric material such as The cover 32 may have the dimensions of a mini-ISO relay cover of 28 millimeters (mm) long by 28 mm wide by 25.5 mm high as illustrated in FIG. 7. The relay assembly 10 may include 6 conductive terminals 24*a*-24*f* that protrude 11.5 mm from the second surface 18 of the circuit board 12 and have a thickness of 0.81 mm. The terminals 24*a*-24*f* may be arranged as illustrated in FIG. 8. Alternatively, if the current carrying capacity of the terminal allows, the coil terminals 24*a* and the common terminals 24*b* may be connected to a single terminal 24*a* so that the relay includes 5 terminals 24*a*, 24*c*-24*f*. In this alternative embodiment, the terminals 24*a*, 24*c*-24*f* may be arranged according to the dimensions shown in FIG. 9.

The example embodiment of the relay assembly 10 presented herein includes two relays. It should be understood that other embodiments may be envisioned that include three or more relays. It should also be understood that other embodiments of the relay assembly 10 may be envisioned that include other electronic components such as capacitors, resistors, diodes, etc.

Accordingly, a relay assembly 10 is provided. The relay assembly includes at least two independent relays 20, 22 and may be packaged in an existing relay package, such as a mini-ISO relay package. Therefore, two relays 20, 22 can now be packaged in a space formerly occupied by a single relay. This provides the advantage of increasing the number of circuits in a vehicle EDC 11 that can be controlled by a relay without increasing the physical size of the EDC 11. In addition, the relay assembly 10 may also include replaceable fusible links 26 to electrically protect the circuits against over-current conditions. This also provides benefits to the physical size of the EDC 11, since it is not necessary to add an additional fusible link receptacles for each additional relay protected circuit.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items.

We claim:

1. A relay assembly, comprising:

a printed circuit board (PCB) having electrically conductive traces disposed on at least a first surface of the PCB;

a first relay having an electrically controlled switching circuit, said first relay mounted on said first surface and electrically coupled to said electrically conductive traces;

a second relay having an electrically controlled switching circuit, said second relay mounted on said first surface and electrically coupled to said electrically conductive traces;

a first electrically conductive terminal disposed on a second surface of the PCB and electrically coupled to said first relay;

a second electrically conductive terminal disposed on the second surface of the PCB and electrically coupled to said second relay, wherein said relay assembly is configured for use in a vehicle electrical distribution center; and wherein said relay assembly further comprises:

a fusible link;

a third electrically conductive terminal electrically coupled to said first relay and said fusible link; and a fourth electrically conductive terminal electrically coupled to said first electrically conductive terminal and the fusible link;

wherein the assembly further comprising a cover configured to enclose at least the first surface of the PCB, and said cover is characterized by the dimensions of 28 millimeters (mm) long by 28 mm wide by 25.5 mm high.

2. The relay assembly according to claim 1, wherein the first and second terminals protrude 11.5 mm from the second surface of the PCB.

3. The relay assembly according to claim 1, wherein the cover defines an opening configured to allow access to the fusible link.

4. The relay assembly according to claim 1, wherein the first and second relays are electromechanical relays.

5. The relay assembly according to claim 1, wherein the first and second relays are metal-oxide-semiconductor field-effect transistors.

* * * * *